United States Patent
Osborn et al.

(10) Patent No.: US 7,232,332 B2
(45) Date of Patent: Jun. 19, 2007

(54) SUPPORT AND GROUNDING STRUCTURE

(75) Inventors: Jay Kevin Osborn, Crowthorne (GB);
Paul Jeffrey Garnett, Camberley (GB);
Graham Bestwick, Newbury (GB)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/337,500

(22) Filed: Jan. 7, 2003

(65) Prior Publication Data

US 2004/0132331 A1 Jul. 8, 2004

(51) Int. Cl.
*H01R 13/00* (2006.01)

(52) U.S. Cl. .................. 439/487; 174/16.3; 361/709

(58) Field of Classification Search .............. 439/485, 439/487, 331, 607; 174/16.3; 361/274.3, 361/697, 702, 709, 514
See application file for complete search history.

(56) References Cited

U.S. PATENT DOCUMENTS

| | | | |
|---|---|---|---|
| 6,205,026 B1 * | 3/2001 | Wong et al. | 174/16.3 |
| 6,442,045 B1 * | 8/2002 | Goodwin et al. | 361/816 |
| 6,477,058 B1 * | 11/2002 | Luebs et al. | 361/784 |
| 6,563,213 B1 | 5/2003 | Wong et al. | |
| 6,579,120 B2 * | 6/2003 | Abbott | 439/607 |
| 6,724,632 B2 | 4/2004 | Lee et al. | |
| 6,746,270 B2 | 6/2004 | Peterson et al. | |
| 2002/0186537 A1 * | 12/2002 | Freuler et al. | 361/713 |
| 2004/0075982 A1 | 4/2004 | Kim et al. | |
| 2004/0120119 A1 | 6/2004 | Lee et al. | |

* cited by examiner

*Primary Examiner*—Tho D. Ta
*Assistant Examiner*—Felix O. Figueroa
(74) *Attorney, Agent, or Firm*—Meyertons Hood Kivlin Kowert & Goetzel, P.C.; B. Noël Kivlin (57) ABSTRACT

Various embodiments of a heat sink assembly are disclosed. In one embodiment, the heat sink assembly includes a processor mounted onto a circuit board; a heat sink located in thermal contact with the processor at the side of the processor opposite circuit board; and an electromagnetic shielding member located between the circuit board and the heat sink. The electromagnetic shielding member is releasably attached to the circuit board. Additionally, or in the alternative, the heat sink is biased toward the processor by a load spring and the electromagnetic shielding member is configured to provide a spring force between the circuit board and the heat sink, counter directional to the bias from the load spring.

17 Claims, 5 Drawing Sheets

SUPPORT AND GROUNDING STRUCTURE

BACKGROUND OF THE INVENTION

The present invention relates to support and grounding structures and in particular, but not exclusively to central processing unit cooler support and grounding structures within a computer system.

One application for the present invention relates to computer systems where physical robustness is required. Examples of such systems include portable computing (so-called "laptop" and "notebook" computers) and in multiple processing engine server systems having replaceable processing engine cartridges or "blades". Blade based computer systems are typically high density computer systems, which systems are typically rack mountable, with one or more processor systems occupying a shelf in the rack. In blade computer systems physically robust blades may be replaceable by unskilled workers and may be expected to be subjected to vigorous or rough handling by those workers. The trend in recent times is to make the computers with smaller form factors. This means that more computers can be located in a rack. This has the advantage of increasing the processing density within the racks, and also the advantage of reducing the distance between the computer systems.

The present invention relates to providing robust and effective cooling and grounding for a central processor unit within a computer system.

SUMMARY OF THE INVENTION

Viewed from a first aspect, the present invention provides a heat sink assembly. The heat sink assembly comprises: a processor mounted onto a circuit board; a heat sink located in thermal contact with the processor at the side of the processor opposite circuit board; and an electromagnetic shielding member located between the circuit board and the heat sink. The electromagnetic shielding member is releasably attached to the circuit board. This arrangement provides for a simplified procedure for assembling the assembly in that the shielding member is held in place in its own right, such that it is held in place during later addition of the heat sink.

In one embodiment, the shielding member is held in place by catch members which are operable to be passed through apertures in the circuit board to grip against the reverse side of the circuit board. This embodiment provides further simplification to a procedure for assembling the assembly in that no separate, small, difficult to handle interlocking parts such as nuts and bolts are required for the fixing of the shielding member.

In another embodiment, the apertures through the circuit board are slots having a long dimension and a short dimension wherein the slots are formed through the motherboard having an orientation according to which the long dimension is arranged to be substantially perpendicular to a nearest edge of the processor. This embodiment provides that the apertures present a low obstruction to the forming of paths or tracks within or on the circuit board radiating away from the processor.

Viewed from a second aspect, the present invention provides a heat sink assembly. The heat sink assembly comprises: a processor mounted onto a circuit board; an electromagnetic shielding member located adjacent the side of the circuit board having the processor mounted thereto; and a heat sink in thermal contact with the processor at the side of the processor opposite the circuit board. The heat sink is biased toward the processor by a load spring and the electromagnetic shielding member is configured to provide a spring force between the circuit board and the heat sink, counter directional to the bias from the load spring. This arrangement provides for stability of the heat sink when the arrangement is fully assembled. The force from the load spring keeps the heat sink in place on top of the processor and the force from the shielding member acts against any tilting of the heat sink relative to the processor to maintain good thermal contact between the heat sink and the processor. This arrangement also helps avoid damage to the processor cause by non-orthogonal loading thereof.

In one embodiment, comprising an attachment member having a loading portion configured to support the load spring and an attachment portion configured to secure the attachment member to the circuit board. This arrangement provides for the load spring to act in relation to the circuit board, thereby creating a self-contained structure.

In another embodiment, a stiffening member is provided for reinforcing the circuit board against the force applied by the load spring. This arrangement provides for the circuit board to be protected from flexing and fracture under the load of the load spring.

BRIEF DESCRIPTION OF THE DRAWINGS

Embodiments of the present invention will be described hereinafter, by way of example only, with reference to the accompanying drawings in which like reference signs relate to like elements and in which.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

DESCRIPTION OF PARTICULAR EMBODIMENTS

Embodiments and examples are described hereafter by way of example only in the following with reference to the accompanying drawings.

Figure 1:
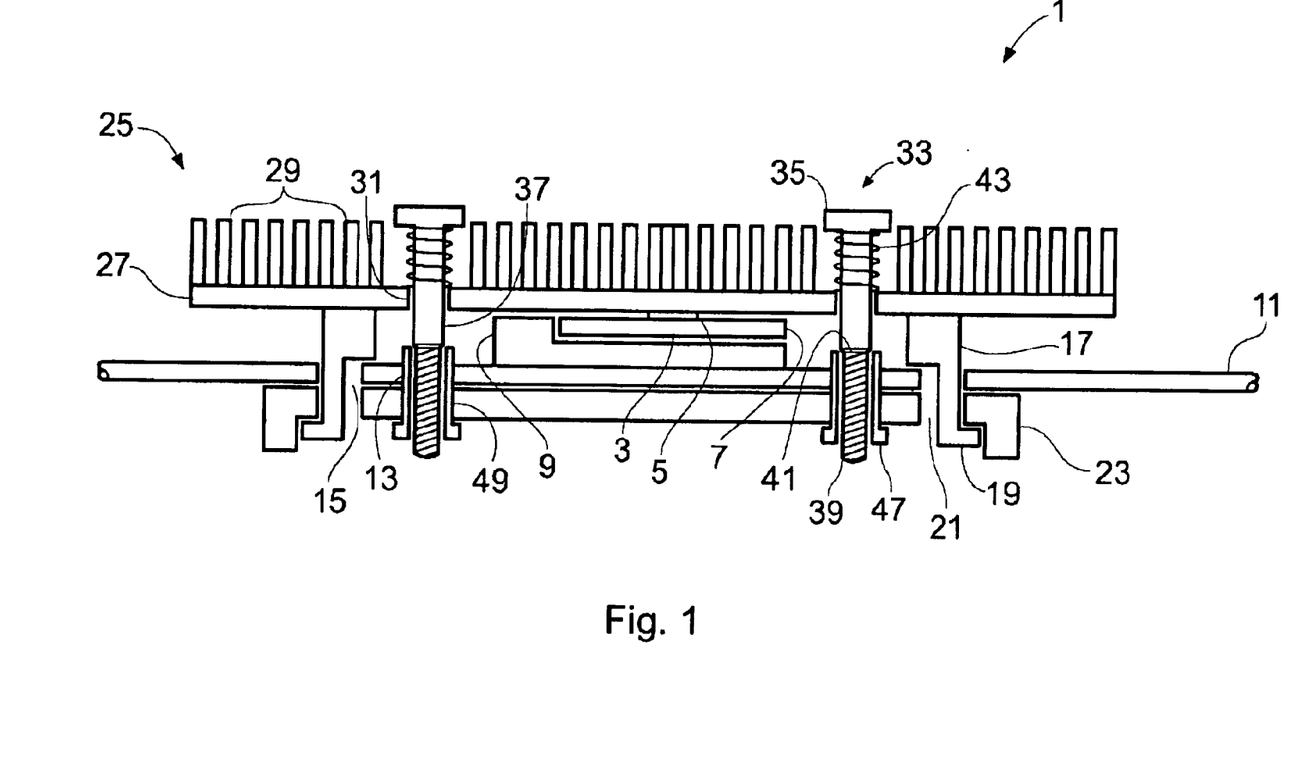
FIG. 1 is a schematic cross section view of a cooling and grounding structure according to a first example.
Figure 2:
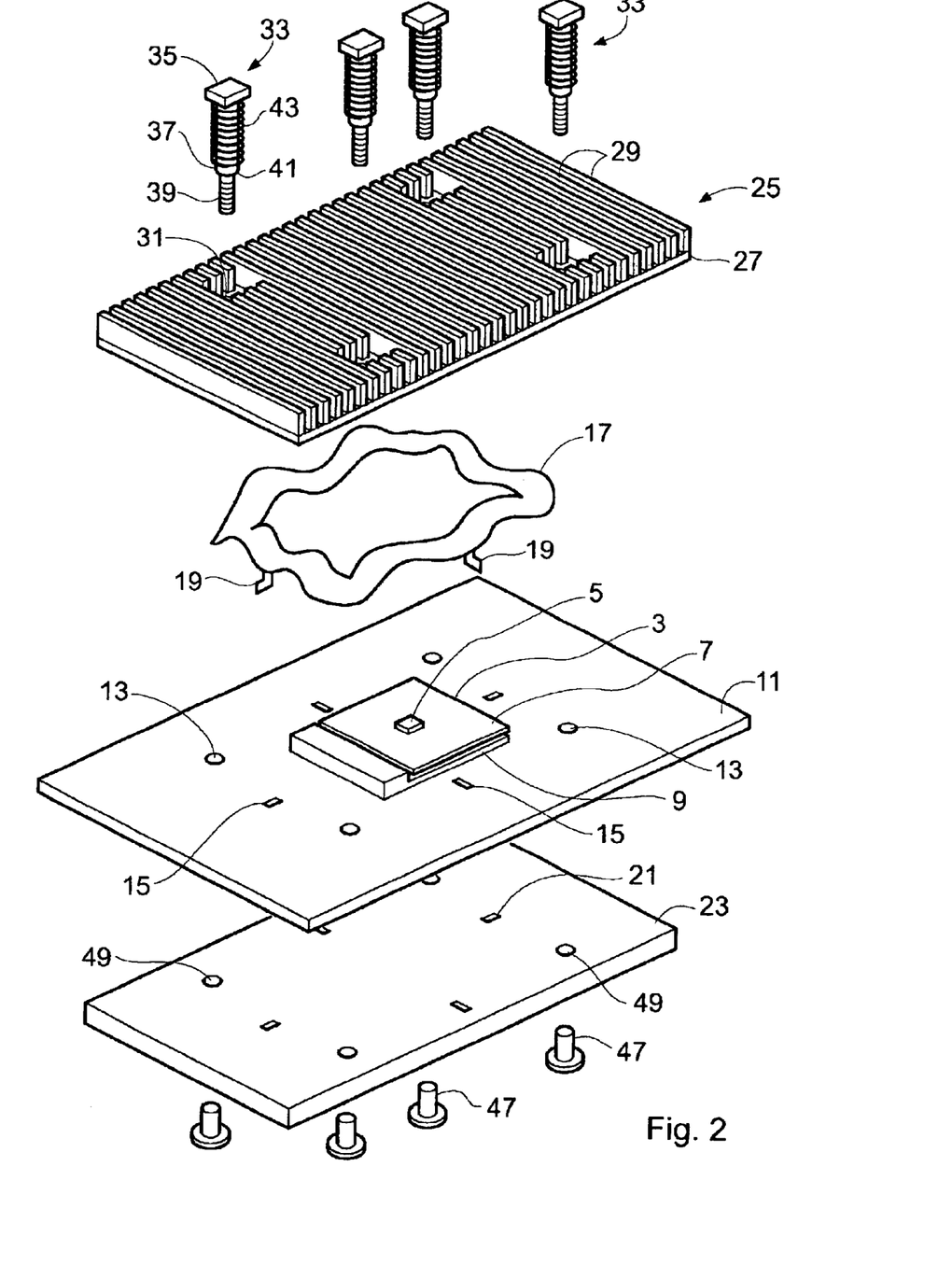
FIG. 2 is an exploded schematic perspective view of the cooling and grounding structure of FIG. 1.
Figure 3:
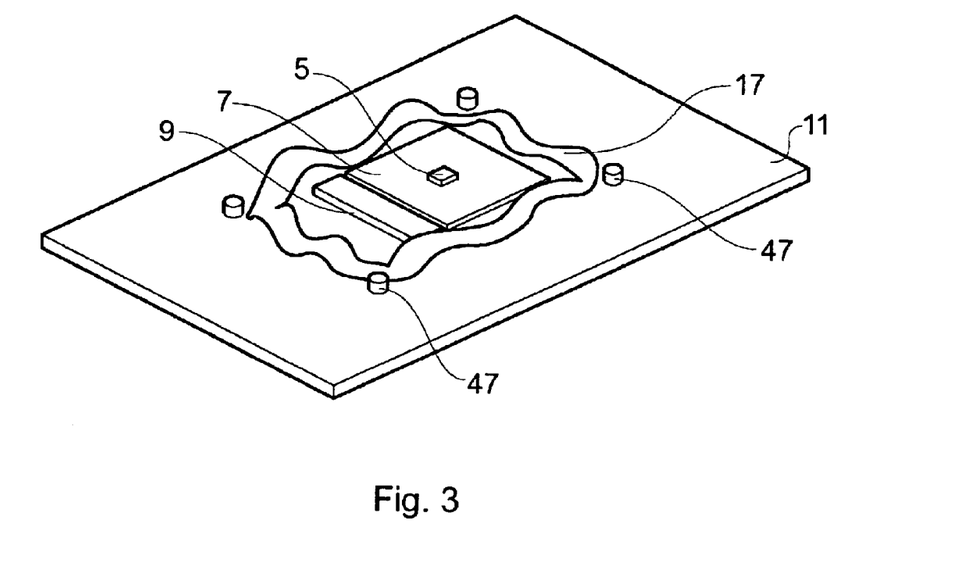
FIG. 3 is a schematic perspective view of part of the cooling and grounding structure of FIG. 1.
Figure 4A:
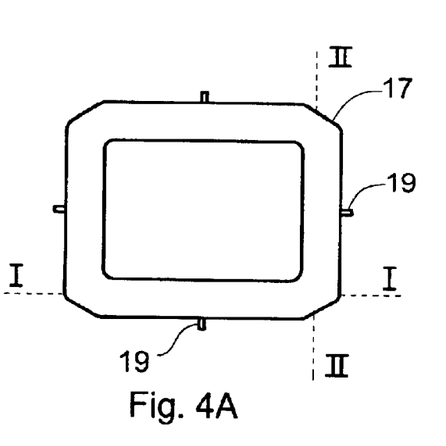
FIGS. 4*a*, 4*b* and 4*c* are views of part of the cooling and grounding structure of FIG. 1.
Figure 4B:
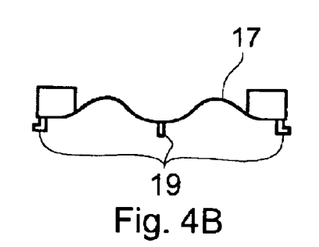
Figure 4C:
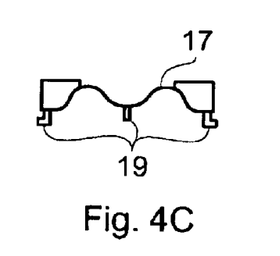

Shown in FIG. 1 is a schematic cross section view of a support and grounding structure 1 according to a first example. FIG. 2 shows the support and grounding structure of FIG. 1 from an exploded perspective viewpoint. FIG. 3 shows part of the support and grounding structure of FIG. 1 from an assembled perspective viewpoint. FIG. 4*a* shows a plan view of a shielding member of the support and grounding structure of FIG. 1 and FIGS. 4b and 4c show sections through the shielding member of FIG. 4a take through lines I—I and II—II respectively.

The grounding and support structure 1 is provided for a processor 3. The processor 3 of the present example has an exposed processor die 5 mounted onto a substrate 7. Examples of processors having this type of design include Celeron series processors manufactured by Intel Corporation and Athlon™ and Duron™ series processor manufactured by Advanced Micro Devices Corporation (AMD). The processor 3 of the present example is retained in a processor socket 9. The socket 9 is attached to a circuit board 11, typically a printed circuit board (PCB). Such an arrangement of a processor in a socket on a circuit board is well known to the skilled addressee and therefore no further description of such arrangements will be presented here. The socket of the present example is a socket of the well-known Zero-Insertion-Force (ZIF) type, although any other IC socket type may be used—as appropriate to the processor used.

The circuit board 11 has formed therethrough at positions located about the socket 9, a plurality of holes 13 and slots 15. These holes and slots provide attachment locations for further components of the grounding and support structure of the present example.

ElectroMagnetic interference (EMI) can cause many problems within computer systems. In particular, a central processor unit of a computer system is a major source of electromagnetic interference. This is at least in part due to the high clock frequencies used in current microprocessors. For example, many microprocessors run at a core clock frequency of 2 GHz or greater. This is compared to a clock frequency of approximately 200–400 MHz for many other components of a computer system. Therefore, in the present example, an EMI shielding "ring" is provided around all sides of the processor to limit EMI to other components of the computer system. Ground planes within the circuit board provide such shielding below the processor, and a heat sink (described below) may be grounded to provide such shielding above the processor. To provide EMI shielding around the sides of the processor, a so-called EMI shielding gasket may be provided.

In the present example, a shielding gasket is provided in the form of EMI shielding member 17. The shielding member 17 comprises a ring of conductive material configured to surround the processor 3. The shielding member 17 is grounded to provide EMI shielding. Shielding member 17 is, in the present example, secured to the circuit board 11 by resilient catch members 19. The catch members 19 extend through the slots 15 in the circuit board and, in the present example, through slots 21 through a bolster plate 23 provided behind the circuit board 11 to provide structural support to the area of the circuit board 1 having the processor socket 9 mounted thereto. The catch members 19 are resiliently biased toward the position shown in FIG. 1, but may be forced inward (toward the processor socket position) to allow passage through the slots 15 and 21 to reach the retaining position shown in FIG. 1. The provision of the catch members allows for a quick and simple assembly procedure for the EMI shielding member 17 and the bolster plate 23 to the circuit board 11. Both the EMI shielding member 17 and the bolster plate 23 are held in position relative the circuit board 11 and processor 3 to simplify a procedure for fitting of a heat sink (described below). Additional benefit is provided in that the EMI shielding member 17 and bolster plate 23 are retained in position about the circuit board 11 without recourse to additional securing parts, thereby obviating any requirement for screws, bolts, nuts or other separate securing means.

Thus use of slots and catch members to retain the EMI shielding member in position provides a benefit that the slots may be much smaller in a width dimension than a hole for receiving a retaining screw, for example. By arranging these slots such that the width dimension of the slot is substantially parallel to the nearest edge of the processor socket, a minimum of obstruction is provided within the circuit board to tracks or lines of the circuit board radiating out from the socket.

Use of slots and catch members to retain the EMI shielding member in position also simplifies an assembly procedure for the support and grounding structure. The use of a retaining member provides a situation where the shielding member (and possibly also the bolster plate) is held in position in its own right, thereby simplifying subsequent attachment of a heat sink. Also the slot and catch member configuration provides for a push-fit type assembly procedure to be used to secure the parts together, thereby avoiding a requirement for small separate parts such as nuts and bolts to be used.

The EMI shielding member 17 is (as is clearly shown in FIGS. 2, 3 and 4) a three-dimensional structure configured to have physical contact with the circuit board 11 and a heat sink above (described below).

Located on top of the processor 3 is a heat sink 25. The heat sink 25 of the present example comprises a heat sink base 27 and heat transfer fins 29. In order that the heat sink provide efficient cooling for the processor die 5, the heat sink is placed in direct thermal contact with the die. As the skilled addressee will appreciate such direct thermal contact typically comprises mounting the heat sink directly onto the processor die and may comprise the use of a layer of thermally conductive grease, state change thermal compound or other heat transfer facilitator between the die and the heat sink. The die of exposed die processors is typically somewhat delicate in nature. In particular, whilst the die is capable of receiving a considerable force thereon to keep a heat sink securely in place, such force should be applied perpendicular to the plane of the die. Any substantial force acting in a direction other than perpendicular to the plane of the die and in particular any force on the edges or corners of the die may cause physical distortion or damage to the die, thereby causing permanent processor failure. Thus the heat sink 25 is arranged to be mounted with the plane of the heat sink base 27 substantially parallel to the plane of the die 5. Also, all attachment forces for holding the heat sink 25 in place against the processor 27 are configured to sum to forces having substantially no component acting parallel to the plane of the die 5.

In the present example, the heat sink 25 is held in place against the processor die 5 by a plurality of attachment bolts 33. Each attachment bolt passes through a hole 31 through the heat sink base 27, through the holes 13 in the circuit board and through corresponding holes 49 through the bolster plate 23. The bolster plate 23 provides a strong member against which the attachment bolts 33 may be fastened, thus permitting secure attachment of the heat sink to the circuit board 11 without causing undesirable flexing in the circuit board. Such flexing may occur in a circuit board without a bolster plate if the stiffness of the circuit board is low compared to the force required to be exerted to ensure good contact between the heat sink and the processor. In the event that the circuit board has sufficient inherent stiffness to prevent the board being damaged by bending caused by attachment of the heat sink, then the bolster plate may be omitted without compromising the functioning of the processor and a computer system of which the processor is a part.

Each attachment bolt 33 comprises a head 35 which may be gripped to tighten or loosen the bolt relative to its mountings, an unthreaded shaft portion 37 attached to the head 35, and a threaded shaft portion 39 at the end of the unthreaded shaft portion distal the head 35. A shoulder 41 is provided at the junction between the threaded and unthreaded shaft portions. Thus the attachment bolt 33 may be tightened hard against a stop member (described below) to prevent over-tightening of the bolt causing damage to the processor, circuit board or bolster plate. Provision for over-tightening protection is made as the mechanical advantage provided by a threaded bolt or screw can be considerable relative to the resistance of a processor die to applied force. Each attachment bolt of the present example is tightened into a collared nut 47. The collar of the nut 47 extends through the holes 13 and 49 in the circuit board and bolster plate (as shown in FIG. 3) and the top surface of the collar provides a surface for the shoulder 41 of the attachment bolt 33 to be tightened against. The nut 47 has an internal thread for conventional thread interaction with the threaded portion 39 of the bolt 33. The internal thread may extend along the whole length of the nut 47 or may extend over only a part thereof. In the present example, the nut 47 is a separate component to the bolster plate 23 and is arranged captive thereto, although in alternative arrangements the nut may be arranged not captive to the bolster plate or may be formed as an integral part of the bolster plate i.e. as a threaded hole.

To ensure that a substantially even force is applied to the heat sink 27 to maintain suitable contact pressure with the processor die 5, a load spring 43 is provided on each attachment bolt 33. The load spring 43 of the present example is a coil-type compression spring which acts between the under surface of the head 35 of the bolt 33 and the top surface of the heat sink base 27. Thus a constant predetermined load may be applied to the top of the heat sink relative to the processor die to provide a predetermined contact force between processor die and heat sink.

An additional feature of the EMI shielding member 17 not described above is that of a balance spring. As noted above, the EMI shielding member of the present example is a three-dimensional structure configured to contact both the circuit board 11 and the heat sink 27 at different points about the perimeter of the processor socket 9. This dual contact arrangement provides that the EMI shielding member 17 may be configured to provide a resilient force between the circuit board 11 and the heat sink 27, thereby acting counter to the force provided by the load springs 43. Balancing of the forces applied by the EMI shielding member 17 and the load springs 43 provides a stabilizing effect for the heat sink 27. As the skilled addressee will appreciate, this stabilizing effect will be greatest in arrangements where the spacing of the contact points between EMI shielding member 17 and the heat sink 27 and the locations of the attachment bolts 33 are all arranged substantially radially equally about the processor die 5 at substantially equal radial distance from the processor die 5, although other arrangements will also provide a satisfactory stabilizing effect.

In the arrangement of the present example, additional robustness of the support and grounding structure is provided. As the skilled addressee will appreciate, in the system as described above, the heat sink is supported from below on the top surface of the processor die 5, and is held down from above by the attachment bolts and load springs.

In the present example, the balance between the "upforce" provided by the EMI shielding member 17 and the "downforce" provided by the load springs 43 is set such that a net "downforce" is provided to ensure good thermal contact between the heat sink 27 and the processor die 5. Substantially no "upforce" is provided at a time when the heat sink 27 and processor die 5 are substantially parallel, but the EMI shielding member 17 is preloaded at such time. Thus in the event of external dynamic forces (for example caused by vigorous handling of the computer system comprising the heat sink arrangement) causing that parallel relationship to be removed, the EMI shielding member 17 provides an upforce to a part of the heat sink 27 which has become closer to the circuit board 11 that that would be when then heat sink 27 and processor die 5 are substantially parallel. Thus the balance spring function of the EMI shielding member 17 provides a stabilizing effect to the heat sink 27. Thus in the event of rough or vigorous handling of a computer system comprising the heat sink support and grounding structure, the heat sink may be maintained in good thermal contact with the processor die and the application to the processor die of a load in a direction not substantially perpendicular to the plane of the processor die may be avoided.

As the skilled addressee will appreciate, other arrangements of balanced downforce and upforce on the heat sink than those described above may be provided. An example of an alternative arrangement to provide a grounding and stabilizing structure will now be described with reference to FIGS. 5 and 6.

Figure 5:
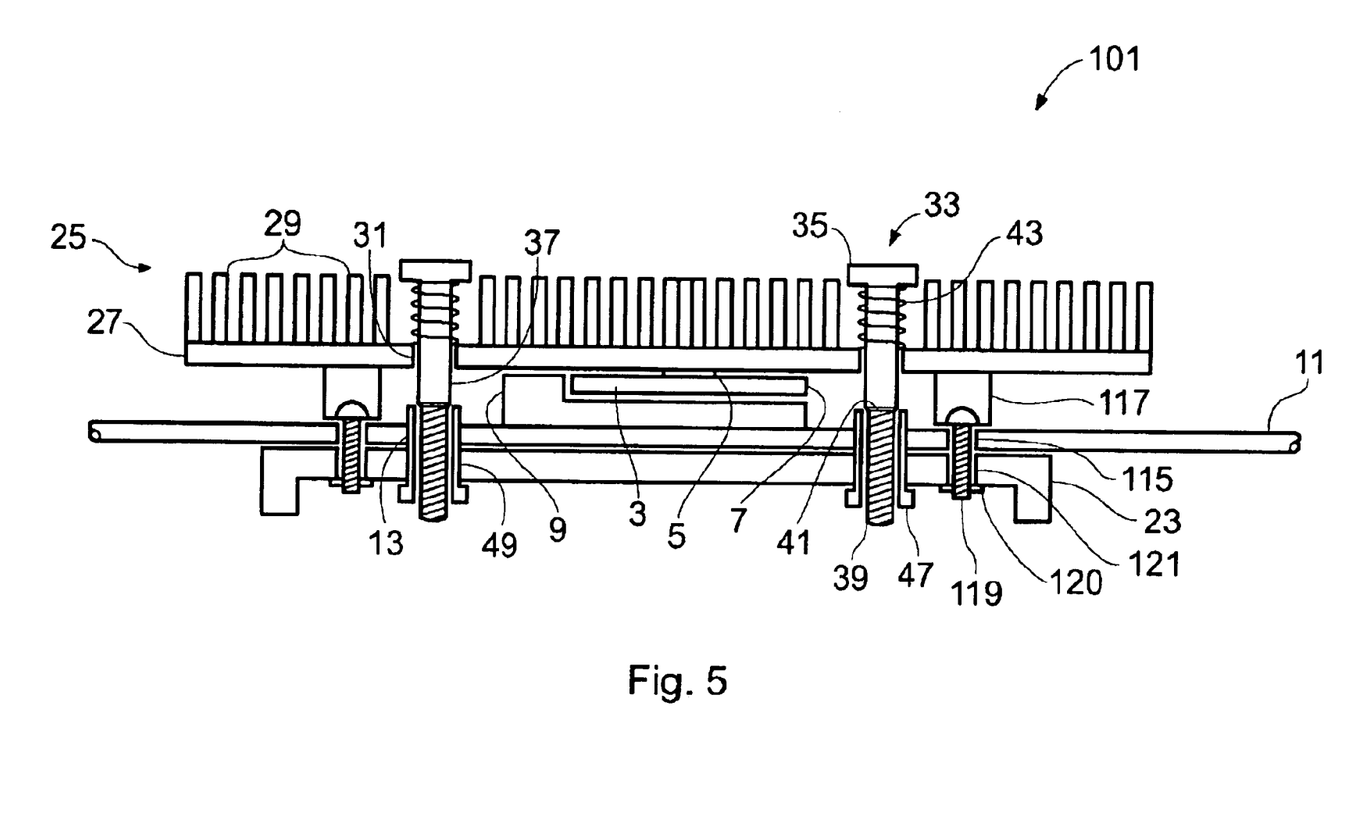
FIG. 5 is a schematic cross section view of a cooling and grounding structure according to a second example.
Figure 6:
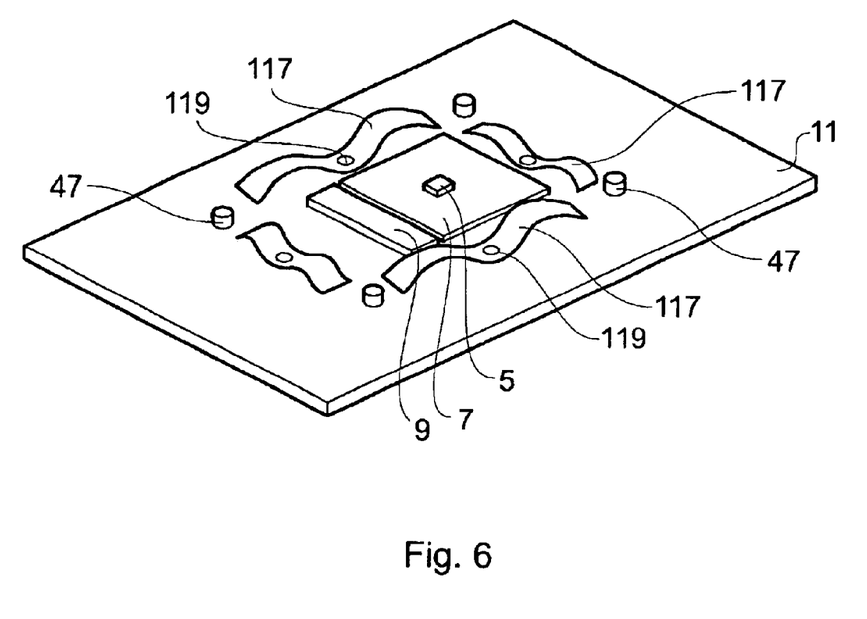
FIG. 6 is a schematic perspective view of part of the cooling and grounding structure of FIG. 4.

Shown in FIG. 5 is a schematic cross section view of a support and grounding structure 1 according to a second example and FIG. 6 shows part of the support and grounding structure of FIG. 5 from an assembled perspective viewpoint. In this second example integers shown in the figures in common with integers of the first example will be accorded the same reference numerals.

In the second example of the support and grounding structure 101, a processor 3 is provided in a socket 9 mounted on a circuit board 11. A heat sink 27 is held in position against the processor die 5 by attachment bolts 33 which attach to nuts 47, which also hold a bolster plate against the circuit board.

The present example also provides EMI shielding member 117, which differs from the shielding member 17 of the first example. The EMI shielding member 117 of the present example comprises four individual members 117. One member 117 being attached to the circuit board about each side of the processor socket 9.

Another difference from the first example, is that the shielding members 117 of the present example are secured to the circuit board 11 and the bolster plate 23 using retaining screws 119, which interfaces with corresponding nuts 120. The retaining screws 119 pass through holes 115 and 121 in the circuit board 11 and the bolster plate 23 respectively.

Use of nuts and bolts to retain the EMI shielding member in position simplifies an assembly procedure for the support and grounding structure. The use of a retaining means provides a situation where the shielding member (and possibly also the bolster plate) is held in position in its own right, thereby simplifying subsequent attachment of a heat sink.

Thus there have now been described two examples of a support and grounding structure. The skilled addressee will appreciate than many deviations from those examples may be made whilst still falling within the scope of the invention. For example, many of the elements of the above-described examples may be substituted for equivalents or alternatives thereto and many other modifications may be made. Examples of possible alternatives, equivalents and modifications are set out hereafter.

Although it has been described above that the top of the collared nut provides a stop member for the shoulder of the attachment bolt to be tightened to, such a stop member may be provided alternatively, for example by a separate washer, by an upstand from the top of the circuit board or by the circuit board itself. In some arrangements, the stop member may be omitted altogether and balancing of the load springs may be provided by other means.

Although it has been described above to provide a bolster plate, this is not essential to the operation of the invention. For example, a circuit board may have sufficient inherent stiffness to resist the forces applied by the attachment bolts unaided. Alternatively, it may be decided that there is insufficient space for a bolster plate within a particular arrangement, or a certain amount of flexing of the circuit board may be determined to be acceptable.

Although it has been described above to use resilient catch members or nuts and bolts to secure the shielding member to the circuit board, many other fixing means may be used. For example, a deformable tab could be provided such that following passing the tab through the holes through the circuit board (and bolster plate if appropriate) the tab could be deformed to provide for retention of the shielding member. Also, the skilled addressee will appreciate that in place of bolts, screws may be used and that the terms "screw" and "bolt" are commonly used interchangeably for any threaded fastening means.

As an option to the above-described examples, further or alternative cooling means may be provided. For example, a cooling fan may be attached to the processor in this way with a separate heat sink as such being omitted. Also, a cooling fan may be provided in addition to the heat sink.

What is claimed is:

1. A heat sink assembly comprising:
    a circuit board;
    a processor mounted onto the circuit board;
    an electromagnetic shielding member located adjacent a side of the circuit board having the processor mounted thereto;
    a stiffening member located adjacent a side of the circuit board opposite the side having the processor mounted thereto, wherein the electromagnetic shielding member is releasably attached to the circuit board and to the stiffening member by a sprung catch; and
    a heat sink in thermal contact with the processor at a side of the processor opposite the circuit board, wherein the heat sink is held in thermal contact with the processor by a plurality of threaded members, wherein each threaded member includes a load spring and a shoulder, wherein the heat sink is biased toward the processor by each of the load springs to hold the heat sink against the processor, wherein each of the shoulders is an unthreaded portion of the threaded member configured to prevent over-tightening of the threaded member and damage to the processor, circuit board, and stiffening member;
    wherein the electromagnetic shielding member is configured to provide a spring force between the circuit board and the heat sink, counter directional to the bias from the load spring; and
    wherein the circuit board and the stiffening member each comprises a slot configured to receive the sprung catch.

2. The heat sink assembly of claim 1, wherein each of the threaded members is configured to secure the heat sink to the circuit board and to the stiffening member.

3. The heat sink assembly of claim 2, wherein each of the threaded members comprises a support surface and wherein each of the load springs is configured to act between the heat sink and the support surface.

4. The heat sink assembly of claim 2, wherein each of the threaded members is an attachment bolt configured releasably to mount the heat sink to the circuit board and to the stiffening member.

5. The heat sink assembly of claim 1, further comprising a fan coupled to the processor.

6. The heat sink assembly of claim 1, wherein the processor is located in a socket attached to the circuit board.

7. The heat sink assembly of claim 6, wherein the electromagnetic shielding member is configured to contact both the circuit board and the heat sink at different points about a perimeter of the socket.

8. The heat sink of claim 1, wherein the electromagnetic shielding member is electrically connected to the heat sink.

9. The heat sink assembly of claim 1, wherein the stiffening member is a bolster plate.

10. The heat sink assembly of claim 1, wherein each of the threaded members is configured to secure the heat sink to the stiffening member through the circuit board.

11. The heat sink assembly of claim 1, wherein the electromagnetic shielding member is located substantially perimetrically about the processor.

12. The heat sink assembly of claim 11, comprising a plurality of individual electromagnetic shielding members located in a perimetric pattern about the processor.

13. The heat sink assembly of claim 11, comprising a unitary electromagnetic shielding member configured to surround the processor.

14. A heat sink assembly comprising:
    a circuit board;
    processor means mounted onto the circuit board;
    electromagnetic shielding means located adjacent a side of the circuit board having the processor means mounted thereto;
    stiffening means located adjacent a side of the circuit board opposite the side having the processor means mounted thereto, wherein the electromagnetic shielding means is releasably attached to the circuit board and to the stiffening means by a sprung catch means; and
    heat sink means in thermal contact with the processor means at a side of the processor means opposite the circuit board, wherein the heat sink means is held in thermal contact with the processor means by threaded means, wherein the threaded means includes load spring means and a shoulder, wherein the heat sink means is biased toward the processor means by the load spring means to hold the heat sink means against the processor means, wherein each of the shoulders is an unthreaded portion of the threaded means configured to prevent over-tightening of the threaded means and damage to the processor means, circuit board, and stiffening means;
    wherein the electromagnetic shielding means is configured to provide a spring force between the circuit board and the heat sink means, counter directional to the bias from the load spring means; and
    wherein the circuit board and the stiffening means each comprises a slot configured to receive the sprung catch.

15. A method for attaching a heat sink to a processor mounted to a circuit board, the method comprising:
    inserting a processor into a processor receiving location of a circuit board;

releasably attaching an electromagnetic shielding member to the circuit board and to a stiffening member with a sprung catch at a position perimetrically about the processor receiving location; and releasably attaching a heat sink to the circuit board and to the stiffening member with a plurality of threaded members, wherein each threaded member includes a load spring and a shoulder, wherein the heat sink is in thermal contact with the processor such that the heat sink is biased toward the processor by each of the load springs to hold the heat sink against the processor, wherein each of the shoulders is an unthreaded portion of the threaded member configured to prevent over-tightening of the threaded member and damage to the processor, circuit board, and stiffening member;

wherein the electromagnetic shielding member is configured to provide a spring force between the circuit board and the heat sink, counter directional to the bias from the load spring;

wherein said releasably attaching the electromagnetic shielding member comprises passing the sprung catch through a slot in both the circuit board and the stiffening member.

16. The method of claim 15, further comprising locating each of the load springs in a position adjacent said heat sink.

17. The method of claim 15, wherein the sprung catch being configured to act against a reverse side of the circuit board to provide retention.

* * * * *